(12) United States Patent
Meng et al.

(10) Patent No.: US 7,126,834 B1
(45) Date of Patent: Oct. 24, 2006

(54) SENSE AMPLIFIER ARCHITECTURE FOR CONTENT ADDRESSABLE MEMORY DEVICE

(75) Inventors: Anita X. Meng, Los Altos, CA (US); Eric H. Voelkel, Ben Lomond, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 7 days.

(21) Appl. No.: 10/930,539

(22) Filed: Aug. 30, 2004

Related U.S. Application Data (60) Provisional application No. 60/502,833, filed on Sep. 12, 2003.

(51) Int. Cl.
*G11C 15/00* (2006.01)

(52) U.S. Cl. .................. 365/49; 365/227; 365/205; 365/204; 365/196

(58) Field of Classification Search .......... 365/49, 365/227, 204, 205, 196
See application file for complete search history.

(56) References Cited

U.S. PATENT DOCUMENTS

| | | | |
|---|---|---|---|
| 4,377,855 A | 3/1983 | Lavi | |
| 5,226,009 A * | 7/1993 | Arimoto | 365/189.04 |
| 5,270,591 A | 12/1993 | Ross | |
| 5,428,565 A | 6/1995 | Shaw | |
| 5,598,115 A * | 1/1997 | Holst | 326/119 |
| 5,936,873 A | 8/1999 | Kongetira | |
| 6,081,440 A | 6/2000 | Washburn et al. | |
| 6,108,227 A | 8/2000 | Voelkel | |
| 6,181,591 B1 * | 1/2001 | Miyatake et al. | 365/49 |
| 6,191,970 B1 | 2/2001 | Pereira | |
| 6,240,000 B1 * | 5/2001 | Sywyk et al. | 365/49 |
| 6,243,280 B1 | 6/2001 | Wong et al. | |
| 6,253,280 B1 | 6/2001 | Voelkel | |
| 6,262,907 B1 * | 7/2001 | Lien et al. | 365/49 |
| 6,266,262 B1 | 7/2001 | Washburn et al. | |
| 6,400,594 B1 * | 6/2002 | Hata et al. | 365/49 |
| 6,420,990 B1 | 7/2002 | Voelkel | |
| 6,442,054 B1 | 8/2002 | Evans et al. | |
| 6,442,090 B1 | 8/2002 | Ahmed et al. | |
| 6,480,406 B1 | 11/2002 | Jin et al. | |
| 6,502,163 B1 | 12/2002 | Ramankutty | |
| 6,504,740 B1 | 1/2003 | Voelkel | |
| 6,505,270 B1 | 1/2003 | Voelkel et al. | |
| 6,515,884 B1 * | 2/2003 | Sywyk et al. | 365/49 |
| 6,647,457 B1 | 11/2003 | Sywyk et al. | |
| 6,661,716 B1 | 12/2003 | Sywyk et al. | |
| 6,697,275 B1 | 2/2004 | Sywyk et al. | |
| 6,721,202 B1 | 4/2004 | Roge et al. | |

(Continued)

OTHER PUBLICATIONS

"A Ternary Content-Addressable Memory (TCAM) Based on 4T Static Storage and Including Current-Race Sensing Scheme" IEEE Journal of Solid-State Circuits, vol. 38, No. 1, Jan. 200, pp. 155-158 by Arsovski et al.

(Continued)

*Primary Examiner*—Viet Q. Nguyen
(74) *Attorney, Agent, or Firm*—Bradley T. Sako (57) ABSTRACT

A content addressable memory (CAM) device (200) can equalize a potential between a match line (202) and corresponding pseudo-supply (PVSS) line (204) in a pre-sense operation. In a sense operation, a sensing device (P4) can determine a match condition exists when the match line (202) potential varies from the PVSS line (204) potential. Complementary compare data lines (CD and BCD) can be equalized with one another in a pre-sense operation, while one compare data line (CD or BCD) can be equalized with bit lines (BB1 and/or BB2) in the sensing operation.

22 Claims, 7 Drawing Sheets

U.S. PATENT DOCUMENTS

| | | | |
|---|---|---|---|
| 6,744,653 B1 * | 6/2004 | Huang | 365/49 |
| 6,751,755 B1 | 6/2004 | Sywyk et al. | |
| 6,760,242 B1 | 7/2004 | Park et al. | |
| 6,763,426 B1 | 7/2004 | James et al. | |
| 6,772,279 B1 | 8/2004 | Sun et al. | |
| 6,804,134 B1 | 10/2004 | Proebsting et al. | |
| 6,804,744 B1 | 10/2004 | Abbas | |
| 6,842,359 B1 * | 1/2005 | Hata et al. | 365/49 |
| 6,845,024 B1 | 1/2005 | Wanzakhade et al. | |
| 6,876,558 B1 | 4/2005 | James et al. | |
| 6,892,273 B1 | 5/2005 | James et al. | |
| 6,903,951 B1 | 6/2005 | James | |
| 6,906,936 B1 | 6/2005 | James | |
| 6,954,823 B1 | 10/2005 | James | |
| 6,958,925 B1 | 10/2005 | Om et al. | |
| 2001/0026464 A1 * | 10/2001 | Hata et al. | 365/49 |
| 2002/0079942 A1 * | 6/2002 | Proebsting | 327/277 |
| 2003/0161209 A1 * | 8/2003 | Gillingham et al. | 365/227 |

OTHER PUBLICATIONS

"A Current-Saving Match-Line Sensing Scheme for Content-Adressable Memories" ISSCC 2003, Session 17, SRAM and DRAM, pp. 17.3 by Arsovski et al., pp. 304-305.

U.S. App. No. 10/873,608, not published, Meng et al.
U.S. Appl. No. 10/180,357, Chou, Richard.
U.S. Appl. No. 10/197,298, Sun et al.
U.S. Appl. No. 10/202,526, Zou, Janet.
U.S. Appl. No. 10/209,142, James et al.
U.S. Appl. No. 10/217,746, Chou, Richard.
U.S. Appl. No. 10/264,667, James, David.
U.S. Appl. No. 10/266,953, Wanzakhade, Sanjay.
U.S. Appl. No. 10/271,660, James, David.
U.S. Appl. No. 10/281,814, James, David.
U.S. Appl. No. 10/320,053, Wanzakhade, Sanjay.
U.S. Appl. No. 10/320,588, Wanzakhade, Sanjay.
U.S. Appl. No. 10/329,146, James et al.
U.S. Appl. No. 10/897,062, Venkatachary, Srinlvasan.
U.S. Appl. No. 10/930,138, Meng, Anita X.
U.S. Appl. No. 10/931,960, Bettman et al.
U.S. Appl. No. 10/940,129, Narum, Steven.
U.S. Appl. No. 10/948,050, Venkatachary et al.
U.S. Appl. No. 10/950,323, Birman et al.
U.S. Appl. No. 10/977,516, Om, Hari.
U.S. Appl. No. 11/000,568, Smith, Scott.
U.S. Appl. No. 11/011,464, Smith, Scott.
U.S. Appl. No. 11/014,123, Om et al.
U.S. Appl. No. 11/043,391, Gupta, Pankaj.
U.S. Appl. No. 11/047,793, Gupta et al.
U.S. Appl. No. 11/085,399, Om, Hari.
U.S. Appl. No. 11//089,837, Smith, Scott.
U.S. Appl. No. 11/090,116, Banachowicz et al.
U.S. Appl. No. 11/146,639, Meheshwari, Dinesh.
U.S. Appl. No. 11/207,323, Venkatachary, Srinivasan.
U.S. Appl. No. 11/219,109, Maheshwari, Dinesh.
U.S. Appl. No. 60/629,694, Jiang, Bin.
U.S. Appl. No. 60/657,754, Maheshwari, Dinesh.
U.S. Appl. No. 60/661,745, Maheshwari, Dinesh.
U.S. Appl. No. 60/663,656, Maheshwari, Dinesh.
U.S. Appl. No. 60/666,875, Maheshwari, Dinesh.
U.S. Appl. No. 60/657,325, Om, Hari.

* cited by examiner

SENSE AMPLIFIER ARCHITECTURE FOR CONTENT ADDRESSABLE MEMORY DEVICE

This application claims the benefit of U.S. Provisional Patent Application Ser. No. 60/502,833 filed on Sep. 12, 2003.

TECHNICAL FIELD

The present invention relates generally to content addressable memory (CAM) devices, and more particularly to sense amplifier architectures for CAM devices that detect match (hit) and mismatch (miss) compare results between a compare data value and stored data values.

BACKGROUND OF THE INVENTION

Content addressable memory (CAM) devices enjoy wide applications due to their ability to provide rapid match results between an applied compare data value (a comparand) and numerous stored data values.

A continuing goal for integrated circuits is that of lower power consumption and/or reduced peak current consumption. In the particular case of CAM devices, compare operations can consume considerable current (and hence power), as such operations typically involve the continuous charging of multiple match lines and/or compare data lines, and the subsequent discharging of such lines.

To better understand such concerns, a compare operation for a conventional CAM device will now be described.

Figure 9:
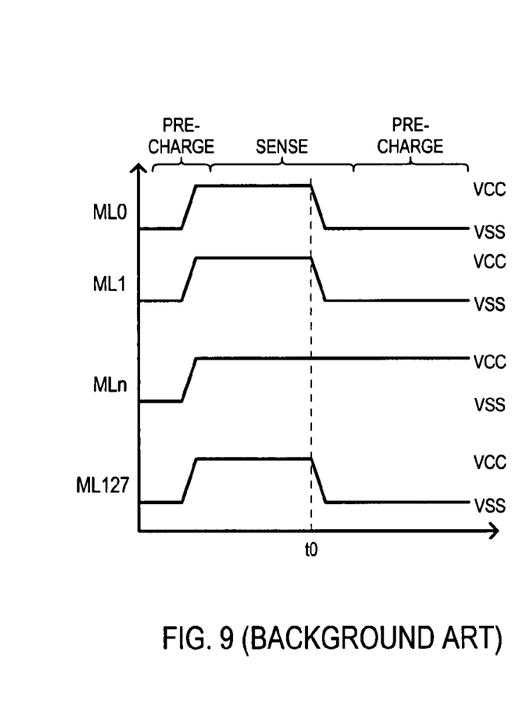
FIG. 9 is a timing diagram showing a conventional compare operation.

Referring to FIG. 9, a conventional compare (e.g., sensing) operation is set forth in a timing diagram. FIG. 9 shows the potentials of 128 match lines ML0 to ML127. In a precharge portion of a compare operation, the match lines (ML0 to ML127) can be precharged to a high potential (VCC). The potential of each match line (ML0 to ML127) can represent the comparison between a comparand value and a data value corresponding to the match line. In a subsequent sensing portion of the compare operation, an applied comparand value can be compared to the stored data values. If a stored data value does not match the comparand value (i.e., a mismatch or MISS condition), the corresponding match line is discharged to a low potential (VSS). In contrast, if a stored data value matches the comparand value (i.e., a match or HIT condition), the corresponding match line remains unchanged at the high potential (VDD).

Referring still to FIG. 9, match lines ML0, ML1 and ML127 indicate a MISS by being discharged at time t0, while match line MLn indicates a HIT by remaining charged at this time.

Following the sensing portion, in a subsequent precharge portion, the match lines (ML0 to ML127) may be precharged once more, so that all lines are returned to a high potential (e.g., VCC or VCC-Vtn).

In a normal operating mode, very few (ideally one) match lines will indicate a HIT and not be discharged, while the majority of match lines will indicate a miss and be discharged. Such discharged match lines will require subsequent precharging to accomplish a next compare operation. Thus, as compare operations are undertaken, the majority of match lines are continuously charged and then discharged, consuming relatively large amounts of power.

Similarly, in a conventional CAM device, a comparand value is typically a multiple bit value. Each bit can be applied by complementary signal lines. Such signal lines can carry complementary logic signals in a compare operation. Alternatively, such signal lines may carry a same logic value in the event a "global" bit masking is implemented. That is, if a comparand value consisted of 16 bits CD0 to CD15, within a CAM device, such bit values could be applied as complementary comparand signals CD0/BCD0, CD1/BCD1 ... CD15/BCD15. As comparand values change for each different compare operation, such comparand lines can be driven to different values. The charging and discharging of lines carrying such complementary comparand bit values can also consume current.

One approach to conserving power in relation to compare data lines is shown in U.S. Pat. No. 6,504,740, titled CONTENT ADDRESSABLE MEMORY HAVING COMPARE DATA TRANSITION DETECTOR issued to Eric H. Voelkel on Jan. 7, 2003 (hereinafter Voelkel). Voelkel discloses an arrangement in which transitions in compare data lines can be avoided for those bits that do not change between subsequent comparand values.

One example of a sense amplifier that can be used in a CAM device is shown in U.S. patent application Ser. No. 10/873,608, filed Jun. 22, 2004, titled SENSE AMPLIFIER CIRCUIT FOR CONTENT ADDRESSABLE MEMORY DEVICE by Anita X. Meng et al. (hereinafter Meng et al.) The contents of this application are included herein with this patent application. Meng et al. discloses an arrangement in which a charge can be conserved by equalizing the potential of a match line with a "pseudo" supply line.

A conventional sense amplifier circuit is disclosed in "A Ternary Content-Addressable Memory (TCAM) Based on 4T Static Storage and Including Current-Race Sensing Scheme", *IEEE Journal of Solid-State Circuits*, Vol. 38, No. 1, January 2003, pp. 155–158 by Arsovski et al Another conventional sense amplifier circuit is shown in "A Current-Saving Match-Line Sensing Scheme for Content-Addressable Memories", ISSCC 2003, Session 17, SRAM and DRAM, Paper 17.3 by Arsovskl at al., pp. 304–305.

Figure 10:
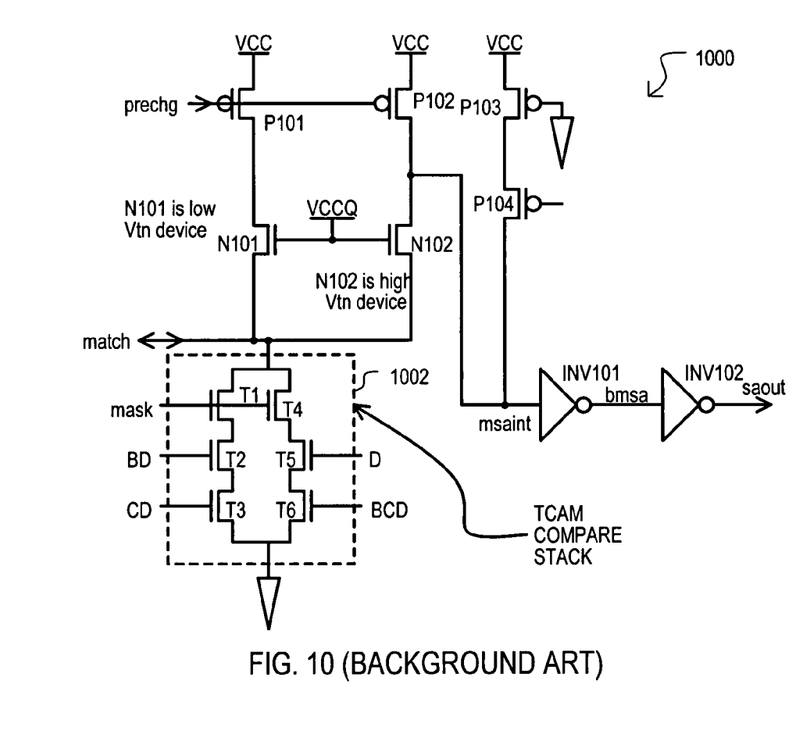
FIG. 10 is a schematic diagram of one example of a conventional sense amplifier.

Yet another conventional sense amplifier is shown in FIG. 10. FIG. 10 shows an example of a single ended sense amplifier employed in a ternary CAM device. In FIG. 10, a sense amplifier 1000 can be coupled to a compare stack 1002. A compare stack 1002 represents one of many bit compares in a sense operation. Such bit compares can compare a compare data value (represented by complementary values CD and BCD) to a data value (represented by complementary values D and BD). A compare result is maskable by a mask value mask. Such a masking capability can form a "ternary" CAM device, as opposed to a binary CAM device.

The conventional sense amplifier 1000 includes p-channel precharge transistors P101 and P102 having sources commonly connected to a power supply voltage VCC, and gates commonly connected to a precharge signal prechg. The conventional sense amplifier 1000 also includes a holding n-channel transistor N 01 and sensing n-channel transistor N102. Transistors N101 and N102 may have drains connected to the drains of transistors P101 and P102, respectively. The sources of transistors N101 and N102 can be commonly connected to a match line match. The gates of transistors N101 and N102 can be commonly connected to a voltage VCCQ. A voltage VCCQ can maintain transistors N101 and N102 in an off state when a match line match is precharged, as will be described below.

The drain—drain connection of transistors P102 and N102 can be connected to a sense node msaint. Sense node msaint can be precharged by precharge p-channel transistor P102 arranged in series between node msaint and power supply voltage VCC. The potential at sense node msaint can be buffered by series connected inverters INV101 and INV102 to provide sense amplifier output signal saout. Transistors P103 and P104 can be optional negative feedback control devices. Transistors P103 and P104 can act as weak "keeper" devices to help maintaining node msaint at a VCC potential.

The operation of the conventional sense amplifier 1000 will now be described.

In a pre-sense period, match line match can be precharged to a voltage VCC-Vtn1. A value Vtn1 can be the threshold voltage of holding transistor N101. It is noted that sensing transistor N102 is designed to have a higher threshold voltage (e.g., at least 200 mV) than holding transistor N101. Thus, once match line match is precharged to VCC-Vtn1, sensing transistor N102 is turned off.

In a sense period, data values can be compared within a compare stack 1002. In the event a sense operation indicates a match (e.g., a HIT), all compare stacks 1002 can maintain a relatively high impedance between the match line match and ground (VSS). In this state, the sense amplifier 1000 can utilize the difference in threshold voltages of transistors N101 and N102, to keep transistor N102 turned off. With transistor N102 turned off, sense node msaint can be maintained at the precharged VCC potential. Consequently, sense amplifier output signal saout remains high, indicating a HIT state. As noted above, it can be optional to connect a weak keeper device as shown in FIG. 10. This can prevent the node msaint voltage from leaking to a lower voltage.

In the event a sense operation indicates a mis-match (e.g., a MISS), at least one compare stacks 1002 will provide a relatively low impedance between the match line match and ground (VSS). Thus, the match line match will go toward ground (VSS). When the gate-to-source voltage of transistor N102 is larger than Vtn2, the sense transistor N102 will turn on. With transistor N102 on, sense node msaint will discharge through sense transistor N102 and the compare stack 1002 to ground (VSS). Consequently, the sense amplifier output signal saout transitions low, indicating a MISS state.

Thus, the conventional sense amplifier 1000 operation can include precharging a match line match to VCC-Vtn1, and then discharging the same match line match in the event of a MISS state. It is understood that a conventional CAM includes numerous match lines, and in operation, MISS states are typically far more common than HIT states. As a result, such match operations can consume considerable current as match lines are continuously precharged and then discharged.

One example of a CAM device that can reduce current consumption is shown in U.S. Pat. No. 6,515,884, titled CONTENT ADDRESSABLE MEMORY HAVING REDUCED CURRENT CONSUMPTION, issued to Stefan P. Sywyk et al., on Feb. 4, 2003 (Sywyk et al.). Sywyk et al. shows a various particular examples of a CAM device that can include a "pseudo-VSS" arrangement that can conserve power by regulating match line discharge paths.

As noted above, it is always desirable to arrive at some way of reducing power consumption and/or peak current in CAM devices. However, such gains should not adversely affect performance, such as by reducing operation speed.

SUMMARY OF THE INVENTION

The present invention can include a content addressable memory (CAM) device. The CAM device can include a plurality of match lines, each coupled to a row of CAM cells, and an electrically isolatable line corresponding to each match line that is coupled to the corresponding match line by at least one equalization device. A sense device can be provided corresponding to each match line, each sense device generating a match indication when the potential of the match line varies from the potential of the corresponding electrically isolatable line.

In such an arrangement, miss/match sensing in a CAM device can be based on a potential variation between two nodes, rather than based on a single node charging or discharging.

According to one aspect of the present invention, a pre-sense device can be coupled between each sense node and a first predetermined potential. Further, a sense device can comprise a sense transistor that provides a low impedance path between the corresponding sense node and a second potential when a match condition occurs between an applied compare data value and data stored in the row of CAM cells. The sense transistor can provide a relatively high impedance path between the corresponding sense node and the second potential when a match condition does not occur between an applied compare data value and data stored in the row of CAM cells.

Such an arrangement can be essentially the opposite of conventional arrangements like that of FIG. 10, as a sensing transistor remains off in the event of a miss, and is turned on in the event of a hit. That is, according to the embodiments, the typically more rare hit condition results in a current draw through the sense transistors, rather than the more common miss condition.

According to another aspect of the embodiments, a CAM device can include a plurality of compare data line pairs that provide a compare data value to each row of CAM cells in a sensing period. Driver devices can electrically connect at least one compare data line of each compare data line pair to a corresponding bit line in the sensing period.

Such an arrangement can allow charge sharing between bit lines and compare data lines to thereby reduce current consumption.

According to another aspect of the embodiments, a CAM device can include a plurality of compare data line pairs that provide a compare data value to each row of CAM cells in a sensing period. Equalization driver devices can electrically connect compare data lines of each compare data line pair to one another in a pre-sensing period, the pre-sensing period being different than the sensing period. In addition, equalization devices can electrically connect corresponding match lines and electrically isolatable lines in the pre-sensing period.

In this way, compare data lines can conserve charge with equalization at the same time match line/isolatable lines conserve charge with equalization.

According to another aspect of the embodiments, a CAM device can include a plurality of compare data line pairs that provide a compare data value to each row of CAM cells in a sensing period. A plurality of bit line pairs can provide data values to each row of CAM cells in a data write operation. A plurality of first driver circuits can be coupled to one compare data line and one bit line. Each first driver circuit can include a first driver transistor having a controllable impedance path coupled between a first supply potential and the bit line, a second driver transistor having a controllable impedance path coupled between the bit line and the compare data line, and a third driver transistor having a controllable impedance path coupled between a second supply potential and the compared data line.

According to another aspect of the embodiments, a compare data control circuit can be coupled to each first driver circuit and can receive a compare data value. Each compare data control circuit can enable the first driver device and disable the second driver device when the compare data value has a first value, enable the second driver device and disable the first driver device when the compare data value has a second value, and disable the first driver device and second driver device in a pre-sensing period that is different than the sensing period.

According to another aspect of the embodiments, each sense device can provide a low impedance path between the corresponding sense node and a second potential after a predetermined first time period when a match condition occurs between an applied compare data value and data stored in the row of CAM cells. Further, at least one dummy match line can generate a dummy match indication regardless of the compare data value after a predetermined second time period that is longer than the first time period. At least one charge supply device can be coupled between each match line and a supply voltage, the charge supply devices being commonly disabled in response to the dummy match indication.

In this way, timing for sense operations can be based on a "dummy" match line. This may provide for more reliable and consistent match timing results.

The present invention may also include a content addressable memory (CAM) device that includes a plurality of compare data line pairs that provide a compare data value to a plurality of CAM cell rows in a sensing period and a compare data line driver circuit corresponding to each compare data line pair. Each compare data line driver circuit can include at least one driver equalization device that electrically connects one compare data line of the pair to an electrically isolatable node in the sensing period, and at least one pre-sensing equalization device that electrically connects the compare data line of the pair to one another in a pre-sensing period, the pre-sensing period being different than the sensing period.

According to one aspect of the embodiment, each compare data line pair can include a compare data line and complementary data line. Each compare data line driver circuit can include a first driver equalization device that connects the compare data line to a first electrically isolatable node when a corresponding compare data value is low, and a second driver equalization device that connects the complementary compare data line to a supply potential when a corresponding compare data value is high.

According to another aspect of the embodiments, a CAM device can include a bit line pair corresponding to each compare data line pair for providing write data to a selected CAM cell row in a write operation. Further, a first electrically isolated node can be a first bit line of the bit line pair, and the second electrically isolated node can be a second bit line of the bit line pair.

According to another aspect of the embodiments, each compare data line driver circuit can include a first driver circuit having a first driver equalization device coupled between a first electrically isolatable node and one compare data line, a first pull up device coupled between a high power supply voltage and the one compare data line, and a first pre-charge device coupled between a low power supply voltage and the first electrically isolatable node.

According to another aspect of the embodiments, at least one electrically isolatable node can include first and second electrically isolatable nodes. Further, each compare data line driver can include at least one pre-sense equalization device coupled between the compare data lines of the compare data line pair, and at least one node equalization device coupled between the first and second electrically isolatable nodes that is enabled in the sensing period.

According to another aspect of the embodiments, each CAM cell rows can be disposed between a corresponding match line and pseudo supply line. Each corresponding match line and pseudo supply line can be electrically connected to one another in the pre-sense period by at least one match equalization device while at the same time being electrically isolated from any power supply voltage.

According to another aspect of the embodiments, a first charging circuit can correspond to each pseudo supply line and can couple a pseudo supply line to a first supply voltage in the sensing period. A second charging circuit corresponding to each match line can couple a match line to a second supply voltage in the sensing period.

According to another aspect of the embodiments, a sensing device can include a p-channel transistor. In alternate arrangements, a sensing device can include an n-channel transistor.

The present invention may also include method for sensing compare results in a content addressable memory (CAM) device. The method can include the steps of, in a pre-sense period, equalizing match lines with corresponding electrically isolatable pseudo supply lines and setting sense nodes corresponding to each match line to mismatch levels. The method can also include, in a sense period, generating a match indication at a match node when the corresponding match line differs in potential from the corresponding pseudo supply line.

In this way, match lines can be preset to "mismatch" levels, unlike conventional arrangements that preset to match levels (e.g., FIG. 10). Further, match line equalization can be employed to share charge and hence reduce power consumption.

According to one aspect of the embodiments, equalizing match lines with corresponding pseudo supply lines can include activating at least one equalization device between each match line and the corresponding pseudo supply line.

According to another aspect of the embodiments, the method can include, in the sense period, comparing a multi-bit compare data value to a multi-bit stored value and providing a first low impedance path between each pseudo supply line and a first supply potential and a second low impedance path between the corresponding match line and a second supply potential.

According to another aspect of the embodiments, the method can include, in the pre-sense period, equalizing compare data line pairs. Further, the sense period can include providing complementary compared data bit values on each compare data line pair.

In this way, a method may include both match line and compare data line equalization for greater power consumption reduction.

According to another aspect of the embodiments, the method can include, in the sense period, providing complementary compared data bit values on compare data line pair by driving one compare data line of each pair to a first supply potential, and equalizing the other compare data line of each pair with at least one electrically isolatable node.

According to another aspect of the embodiments, the method can further include providing write data on at least one bit line in a write operation, and at least one electrically isolatable node includes at least one bit line.

DETAILED DESCRIPTION

According to embodiments of the present invention, a content addressable memory (CAM) device can provide match results by detecting a match (HIT) result, rather than mismatch (MISS) results. In the particular embodiments shown, such a result can be accomplished by equalizing a match line with a corresponding "pseudo-VSS" line, and then detecting when the match line varies in potential from the "pseudo-VSS" line. Further, a CAM device according to the present invention can allow for equalization of complementary compare data lines both before a sensing period, as well as during a sensing period. Such a "double" equalization scheme can further reduce power consumption and/or peak current.

Figure 1:
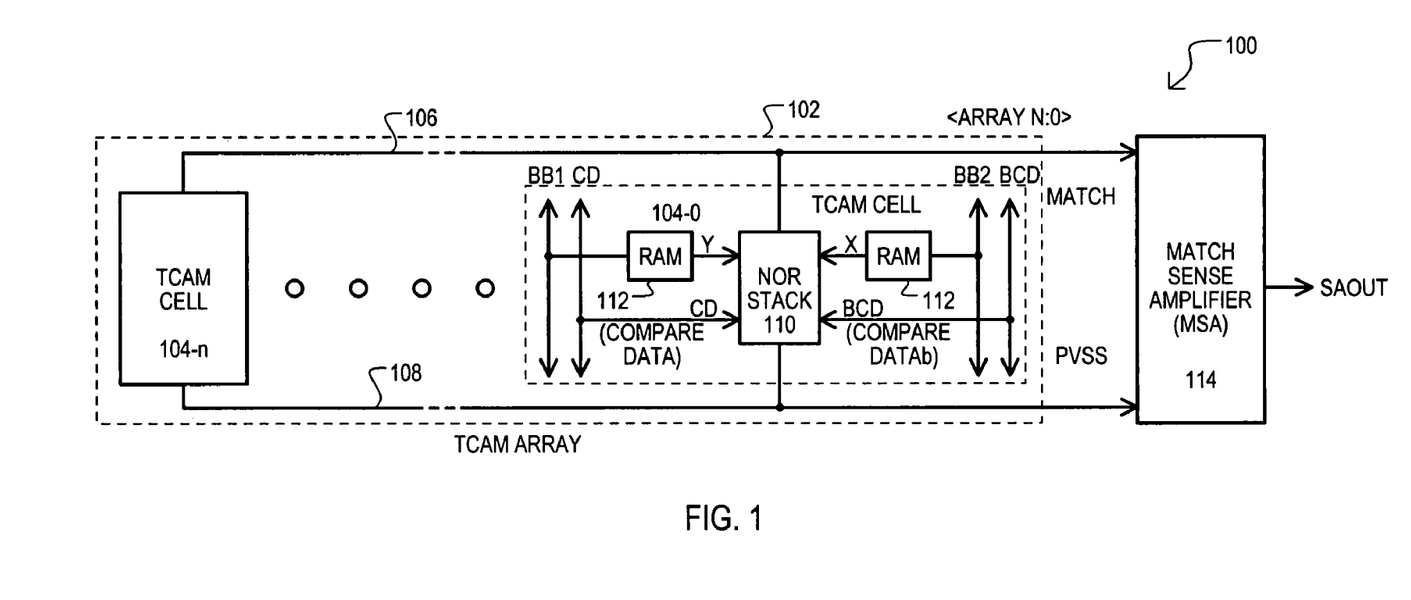
FIG. 1 is a block diagram showing a content addressable memory (CAM) device according to one embodiment of the present invention.

FIG. 1 shows one particular application of a CAM device according to one embodiment of the present invention. As shown in FIG. 1, a CAM device 100 can include a CAM array 102 in which one or more CAM cell rows are formed. Each CAM cell row of a CAM array 102 can include a number of CAM cells, shown as 104-*n* to 104-0. CAM cells (104-*n* to 104-0) can be commonly coupled to a match line 106 and a pseudo-VSS line 108.

A match line 106 can provide a signal MATCH that can indicate if an applied compare data value (comparand) matches a stored data value. A pseudo-VSS line 108 can provide an isolatable potential node—and thus can be distinguished from a power supply node, such as VSS.

In the example of FIG. 1, each CAM cell (104-*n* to 104-0) can include a logic stack 110 that selectively provides a relatively low impedance path between a match line 106 and pseudo-VSS line 108 according to match data values and compare data values. The particular logic stack 110 of FIG. 1 is a NOR stack (e.g., a logic circuit that provides a NOR, XNOR or similar function), which receives data values X and Y and compare data values CD and BCD as inputs. Data values (X and Y) can be provided from a random access memory (RAM) cell, or the like 112. Compare data values (CD and BCD) can be complementary values supplied to a memory cell for a compare operation (e.g., one bit of a comparand value presented as two complementary values).

It is noted that the RAM cell 112, while illustrated as two separate boxes in FIG. 1, may be a single RAM cell that provides complementary values X and Y in the case of a binary CAM device. In the case of a ternary CAM device, one RAM cell can provide a data value while another can provide a mask value. Of course, other storage structures could provide a data and/or mask value, including but not limited to ROM or other type storage circuits.

A sense amplifier 114 can detect a match indication between a match line 106 and PVSS line 108 to determine a match indication or mismatch indication.

Figure 2:
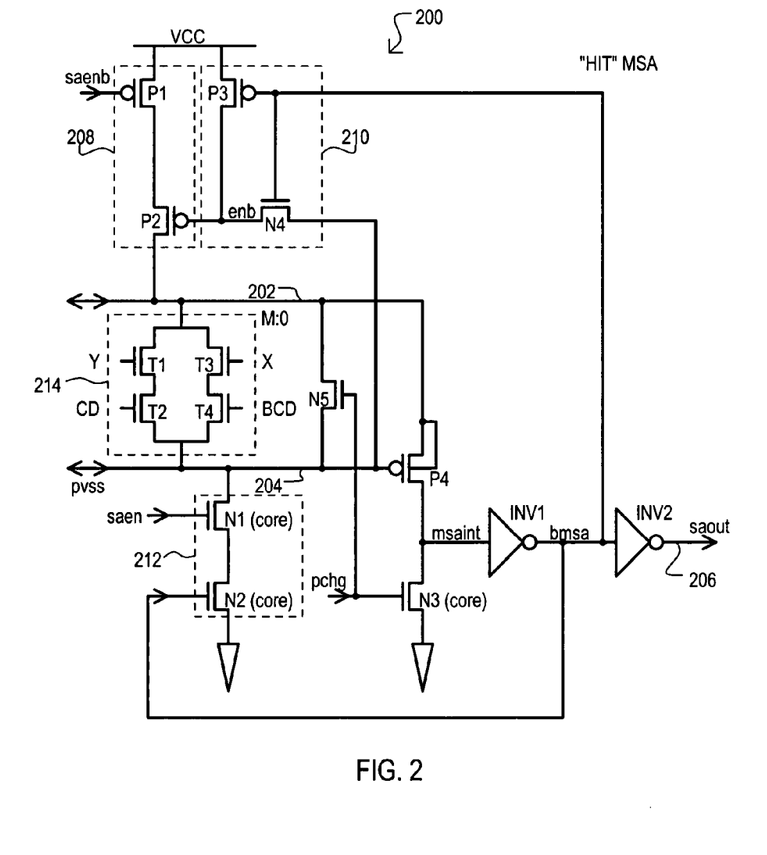
FIG. 2 is a schematic diagram of a sense amplifier according to an embodiment of the present invention.

A sense amplifier circuit according to one embodiment is set forth in FIG. 2, and designated by the general reference character 200. A sense amplifier 200 can include a match line 202 and a pseudo-VSS (hereinafter PVSS) line 204 as inputs. A sense operation result, saout, can be generated at a sense node 206.

A sense amplifier 200 can also include a charge circuit 208, a feedback circuit 210, a sensing device P4, a discharge circuit 212, a pre-sense device N3, and an equalization device N5. Still further, a sense amplifier 200 can also include two inverters INV1 and INV2 arranged in series.

A charge circuit 208 can include a p-channel transistor P1 having a source-drain path arranged in series with another p-channel transistor P2. P-channel transistor P1 can receive a sense amplifier enable signal saenb at its gate, while p-channel transistor P2 can have a gate connected to an enable node enb. A charge circuit 208 can provide a low impedance path between match line 202 and a high power supply VCC.

A feedback circuit 210 can include a p-channel transistor P3 and an n-channel transistor N4. P-channel transistor P3 can have a source-drain path connected between the enable node enb and a high power supply VCC, and a gate connected to sense amplifier output node bmsa. N-channel transistor N4 can have a source-drain path connected between enable node enb and a PVSS line 204, and a gate connected to sense amplifier output node bmsa. A feedback circuit 210 can disable a charging operation of charge circuit 208 according to a match result.

A sensing device P4 can be a p-channel transistor with a source and body connected to match line 202, a drain connected to a sense node msaint, and a gate connected to PVSS line 204. An n-well for sensing device P4 can be connected to its source, or optionally connected to VCC. Unlike conventional approaches, sensing device P4 can detect a match (HIT) result, as opposed to a mismatch (MISS) result.

A discharge circuit 212 can include an n-channel transistor N1 having a source-drain path arranged in series with another n-channel transistor N2. N-channel transistor N1 can receive a sense amplifier enable signal saen at its gate, while n-channel transistor N2 can have a gate connected to a sense amplifier output node bmsa. A discharge circuit 212 can provide a low impedance path between PVSS line 204 and a low power supply VSS.

A pre-sense device N3 can include an n-channel transistor having a source-drain path arranged between a sense node msaint and a low power supply VSS. N-channel transistor N3 can receive a precharge signal pchg at its gate. A pre-sense device N3 can set sense node msaint to a predetermined potential (in this case low, or VSS) in response to precharge signal pchg.

An equalization device N5 can include an n-channel transistor having a source-drain path arranged between match line 202 and PVSS line 204, and a gate connected to the precharge signal pchg. An equalization device N5 can equalize the potential between match line 202 and PVSS line 204 in response to the precharge signal pchg.

Inverters INV1 and INV2 can be arranged in series. Inverter INV1 can have an input connected to sense node msaint and an output connected to sense amplifier output node bmsa. Inverter INV2 can have an input connected to sense node bmsa and an output connected to sense amplifier output node saout.

FIG. 2 also shows one CAM cell portion 214 situated between match line 202 and PVSS line 204. A CAM cell portion 214 can include transistors T1 and T2 having source-drain paths arranged in series, transistor T1 can receive a data value Y at its gate, while transistor T2 can receive a compare data bit value CD at its gate. Transistors T3 and T4 can have source-drain paths arranged in series with one another, and in parallel with transistor T1 and T2. Transistor T3 can receive a data value X at its gate. T4 can receive a complementary compare data bit value BCD at its gate.

Figure 3:
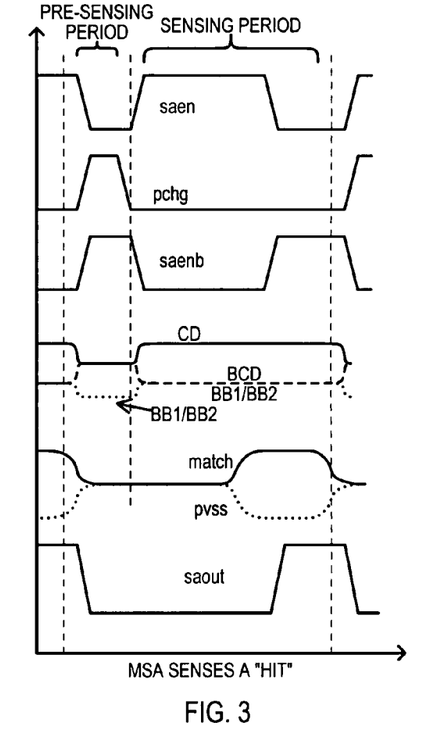
FIG. 3 is a timing diagram showing the operation of the embodiment shown in FIG. 2.

The operation of a sense amplifier 200 will now be described in conjunction with a timing diagram shown in FIG. 3. FIG. 3 shows an active high sense amplifier enable signal saen, a precharge signal pchg, an active low sense amplifier enable signal saenb, a response of complementary comparand lines CD/BCD in relation to bit lines BB1 and BB2, a response of match line 202 (match) and PVSS line 204 (pvss), and a response of sense amplifier output node saout. CAM cell portion 214 can represent one of a number of CAM cells arranged in parallel between match line 202 and PVSS line 204.

As shown in FIG. 3, the operation of a sense amplifier 200 can be divided into a pre-sensing period and a sensing period. A pre-sensing period can be about ¼ of a clock cycle, while a sensing period can be about ¾ of a sensing period.

In a pre-sensing period, a sense amplifier enable signal saen can transition from a high level to a low level, turning off transistor N1 within discharge circuit 212. Precharge signal pchg can transition to an active (in this case high) level, turning on pre-sense device N3 and equalization device N5. Sense amplifier enable signal saenb can transition high, turning off transistor P1 within charge circuit 208.

Also in the pre-sensing period, complementary comparand lines CD/BCD can be equalized, while bit lines BB1/BB2 can be set to a lower potential (e.g., VSS). The equalization of comparand lines (CD/BCD) and bit lines (BB1/BB2) will be described in more detail at a later point herein.

With pre-sense device N3 turned on, sense node msaint can be set to a low level (e.g., VSS). By operation of inverters INV1 and INV2, such a low value can be inverted to drive sense amplifier output node bmsa high and node saout low. With node bmsa high, transistor P3 in feedback circuit 210 can be turned off, while transistor N4 is turned on. Further, transistor N2 in discharge circuit 212 can be turned on.

It is noted that the above arrangement can be repeated for all sense amplifier output nodes. Thus, according to the above embodiment, sense amplifier nodes can be preset to a MISS (low in this case) state. This is in contrast to conventional approaches that preset sense nodes to a HIT state.

With equalization device N5 turned on, the potential of match line 202 and PVSS line 204 can be equalized. This is in sharp contrast to conventional cases that precharge a match line to a high potential for subsequent discharge in the event of a mismatch.

At the end of pre-sensing period, sense amplifier enable signal saen can return high, turning on transistor N1 within discharge circuit 212. It will be recalled that transistor N2 is already turned on, due to the high value and sense amplifier output node bmsa. Consequently, PVSS line 204 can be pulled toward a low (e.g., VSS) potential. Further, precharge signal pchg can transition to an inactive (in this case low) level, turning off pre-sense device N3 and equalization device N5. As a result, sense node msaint can be isolated from the VSS potential, and match line 202 and PVSS line 204 can be isolated from one another by a row of CAM cells (represented by portion 214). Sense amplifier enable signal saenb can transition high, turning on transistor P1 within charge circuit 208. This can provide a high potential at the source of transistor P2.

In the sensing period, complementary comparand lines CD/BCD can be driven to complementary values. As will be described at a later point herein, one comparand line (CD or BCD) can be driven to a high supply potential VCC, while another comparand line (BCD or CD) can be driven to a low value by equalizing the comparand line with a bit lines BB1 and BB2, which were previously at a low supply (e.g., VSS) potential. This operation will be described in more detail at a later point herein.

In the sensing period, the operation of a sense amplifier 200 can vary according to whether the sensing operation detects a match (e.g., HIT) or a mis-match (e.g., MISS).

In the event of a HIT, match line 202 will remain essentially electrically isolated from PVSS line 204. As a result, match line 202 will begin to rise in potential due to the operation of charge circuit 208. In particular, the source of transistor P2 will be high due to the operation of transistor P1, while its gate is low due to the operation of transistor N4. This can turn on transistor, P2, thus raising the potential of match line 202.

Also in the event of a HIT, as the potential of match line 202 rises, the potential of PVSS line 204 falls. When this potential difference exceeds the threshold voltage (Vtp) of transistor P4, transistor P4 can turn on, pulling sense node msaint to a higher potential. When the potential at msaint node exceeds a threshold of inverter INV1, inverter INV1 drives sense amplifier output node bmsa low. This drives sense amplifier output node saout high, indicating a match (HIT) condition.

A sense amplifier 200 according to the embodiment of FIG. 2 also includes current conserving aspects. In particular, in the event of a HIT, as sense amplifier output node bmsa is driven low. Within feedback circuit 210, transistor P3 is turned on and transistor N4 is turned off, pulling enable node enb high. This turns off transistor P2, once again isolating match line 202 from a high voltage. At the same time, a low level at node bmsa results in transistor N2 being turned off. This isolates PVSS line 204 from a low voltage.

In this way, current paths to match line 202 and PVSS line 204 are automatically isolated in the event of a hit.

In the event of a MISS, match line 202 can be electrically connected to PVSS line 204. Thus, match line 202 and PVSS line 204 will essentially track one another in potential, maintaining the source and gate of sense transistor P4 at essentially the same voltage. As a result, sense transistor P4 can remain turned off, and sense node msaint can remain at the pre-set low potential. Sense amplifier output node bmsa remain high, while sense amplifier output node saout remains low, indicating a MISS condition.

Additional current conserving aspects are included for both the HIT or MISS case. In particular, at the end of a sensing period, sense amplifier enable signal saen can transition low and sense amplifier enable signal saenb can transition high. This can turn off transistor P1 within charge circuit 208 and N1 within discharge circuit 212, disabling current paths to the match line 202 and PVSS line 204.

In a preferred embodiment, a match line 202 and PVSS line 204 can be equalized to a potential that is about ⅓ that of a high power supply VCC. More particularly, when a CAM device 200 has a power supply voltage of 1 volt, match lines and PVSS lines can be equalized to about 300 mV.

In a preferred embodiment, either or both of transistors N1 and N2 can be high threshold voltage transistors. Such an arrangement can reduce leakage current from a CAM cell portion 214 (compare stack). Once a HIT has been detected, leakage current through the compare stack may only charge up a PVSS line 204.

Of course, while FIG. 3 shows on example of a CAM cell portion 214 (compare stack), such an arrangement should not be construed as limiting the invention thereto.

One particular approach to timing the termination of the sense operation (i.e., the timing at which saen returns low and saenb returns high) will be described in more detail below.

Figure 4:
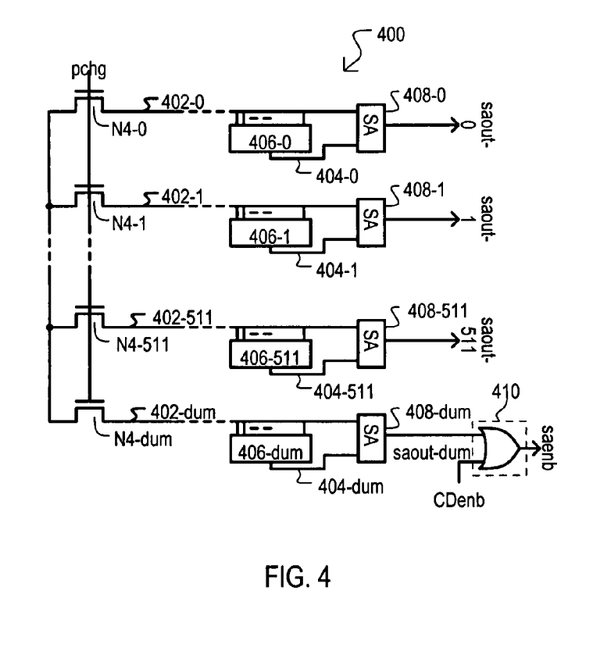
FIG. 4 is a block schematic diagram of a CAM device according to an embodiment.

One approach to generating a sense amplifier enable signal, such as saen and/or saenb, is set forth in a schematic diagram in FIG. 4. FIG. 4 shows a CAM device 400 that includes a number of "normal" match lines 402-0 to 402-511, as well as corresponding pseudo-VSS lines 404-0 to 404-511, sense amplifier output nodes saout-0 to saout-511, CAM rows 406-0 to 406-511, and sense amplifiers 408-0 to 408-511. Each sense amplifier (408-0 to 408-511) can have a structure like that shown in FIG. 2.

A CAM device 400 may further include a dummy match line 402-dum, a corresponding dummy pseudo-VSS line 404-dum, dummy sense amplifier output node saout-dum, dummy CAM row 408-dum, and sense amplifier 408-dum. Further, normal match lines 402-0 to 402-511 and dummy match line 402-dum can be commonly connected to one another by precharge devices N4-0 to N4-511 and N4-hum, respectively. Precharge devices N4-0 to N4-511 and N4-dum can be n-channel transistors having gates commonly connected to a precharge signal pchg. Thus, in a pre-sensing period, when precharge signal pchg is high, normal match lines 402-0 to 402-511 and dummy match line 402-dum can be precharged to a same precharge potential.

A dummy CAM row 406-dum can always generate a hit condition. That is, within any given sensing period, saout-dum can be driven high. However, the generation of such a dummy hit signal can be timed to occur later than a normal hit signal. As but one very particular example, saout-dum can be driven high about 300 picoseconds after a normal HIT indication.

Referring still to FIG. 4, a HIT indication (e.g., saout-dum) generated with dummy word line 402-dum can be utilized to generate a sense amplifier enable signal saenb and/or saen. Thus, FIG. 4 includes a logic circuit 410 for generating a sense amplifier enable signal saenb. In the very particular example shown, a logic circuit 410 can be an OR gate that receives the output saout-dum from dummy sense amplifier 408-dum as one input, and a compare data enable signal CDenb as another input. A compare data enable signal CDenb can ensure that saenb is off during a precharge period (e.g., high), and is on (e.g., VSS) at the beginning of a sensing period. The dummy sense amplifier 408-dum can provide global feedback control. That is, all sense amplifiers (408-0 to 408-511) can be turned off a predetermined delay after output signal saout-dum goes high (e.g., 300 pS, as but one very particular example). Turning off the sense amplifiers in this way further saves power. Of course, this represents but one possible implementation. Further, it is understood that a sense amplifier enable signal saen can be generated by inverting sense amplifier enable signal saenb.

In this way, current paths can be automatically disabled a predetermined time after sensing operations have started.

As indicated above, according to the present invention, compare lines CD/BCD can be equalized during a pre-sensing period. Further, one of the compare lines can be equalized in the sensing period. One approach to such a unique double equalization arrangement is set forth in FIG. 5.

Figure 5:
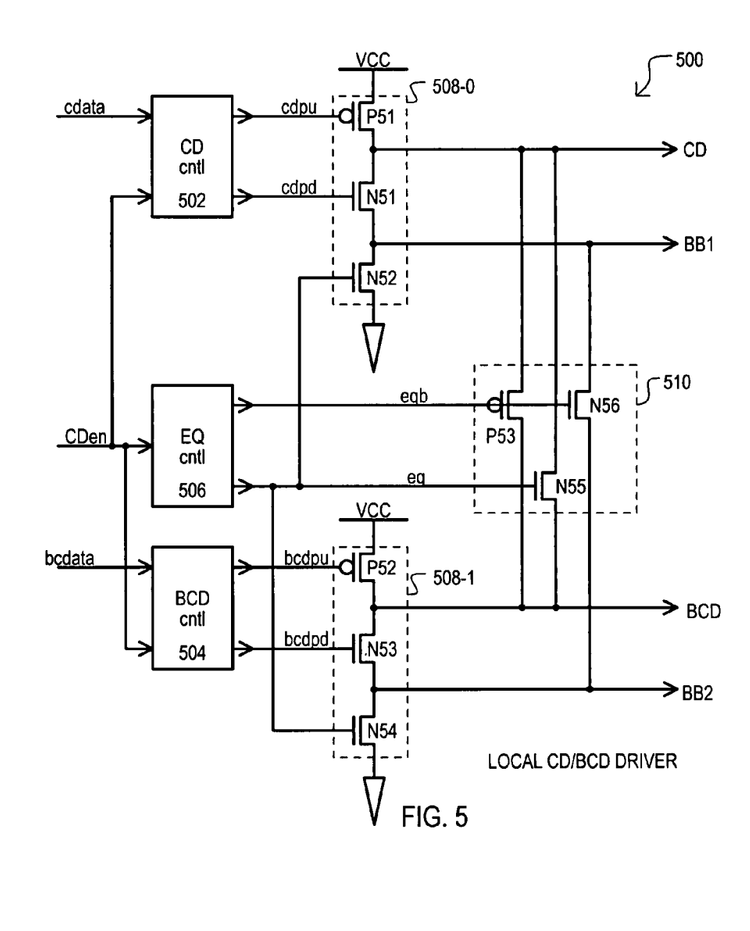
FIG. 5 is a block schematic diagram of a compare data line driver according to one embodiment.

FIG. 5 is a block schematic of a compare data line driver arrangement according to one embodiment. The particular circuit of FIG. 5 is designated by the general reference character 500, and can drive complementary compare data lines CD and BCD and bit lines BB1 and BB2, in response to complementary compare data values cdata and bcdata and a compare data enable signal CDen.

The particular driver circuit 500 of FIG. 5 includes a compare data control circuit 502, a complementary compare data control circuit 504, and an equalization control circuit 506. The circuit 500 can also include a first driver circuit 508-0, second driver circuit 508-1, and equalization circuit 510.

A compare data control circuit 502 can receive a compare data value cdata and compare data enable signal CDen as inputs. When enabled by an active compare data enable signal CDen (high for example), compare data control circuit 502 can drive a pull-up signal cdpu and pull-down signal cdpd in response to the compare data value cdata. In particular, when a compare data value cdata is high, pull-up signal cdpu and pull-down signal cdpd can both be driven low. Conversely, when a compare data value cdata is low, pull-up signal cdpu and pull-down signal cdpd can both be driven high.

In a similar fashion, complementary compare data control circuit 504 can receive a complementary compare data value bcdata and compare data enable signal CDen as inputs. When enabled by an active compare data enable signal CDen, complementary compare data control circuit 504 can drive a pull-up signal bcdpu and pull-down signal bcdpd in response to the complementary compare data value bcdata. In particular, when a complementary compare data value bcdata is high, pull-up signal bcdpu and pull-down signal bcdpd can both be driven low. Conversely, when a complementary compare data value bcdata is low, pull-up signal bcdpu and pull-down signal bcdpd can both be driven high.

Both compare data control circuit 502 and complementary compare data control circuit 504 can provide high impedance state control signals when compare data enable signal CDen is inactive (e.g., low). Such a high impedance state can include a pull-up signals cdpu and bcdpu being high, while pull-down signals cdpd and bcdpd are low.

Equalization control circuit 506 can receive the compare data enable signal CDen and provide complementary equalization signals eq and eqb as output signals. In particular, when compare data enable signal CDen is high, equalization signal eq can be low and equalization signal eqb can be high. Conversely, when compare data enable signal CDen is low, equalization signal eq can be high and equalization signal eqb can be low.

First driver circuit 508-0 can include p-channel transistor P51, n-channel transistor N51, and n-channel transistor N52 having source-drain paths arranged in series between a high power supply VCC and a low power supply VSS. The gate of transistor P51 can receive pull-up signal cdpu. The gate of transistor N51 can receive pull-down signal cdpd. The gate of transistor N52 can receive equalization signal eq. A drain—drain connection between transistors P51 and N51 can be connected to compare data line CD. A source-drain connection between transistors N51 and N52 can be connected to bit line BB1.

Second driver circuit 508-1 can include p-channel transistor P52, n-channel transistor N53, and n-channel transistor N54 having source-drain paths arranged in series between a high power supply VCC and a low power supply VSS. The gate of transistor P52 can receive pull-up signal bcdpu. The gate of transistor N53 can receive pull-down signal bcdpd. The gate of transistor N54 can receive equalization signal eq. A drain—drain connection between transistors P52 and N53 can be connected to complementary compare data line BCD. A source-drain connection between transistor N53 and N54 can be connected to bit line BB2.

Equalization circuit 510 can include p-channel transistor P53 and n-channel transistor N55 having a source-drain paths connected in parallel between compare data line CD and complementary compare data line BCD. In addition, an n-channel transistor N56 can have a source-drain path connected between bit lines BB1 and BB2. The gates of transistors P53 and N56 can receive the equalization signal eqb. The gate of transistor N55 can receive the equalization signal eq.

Figure 6:
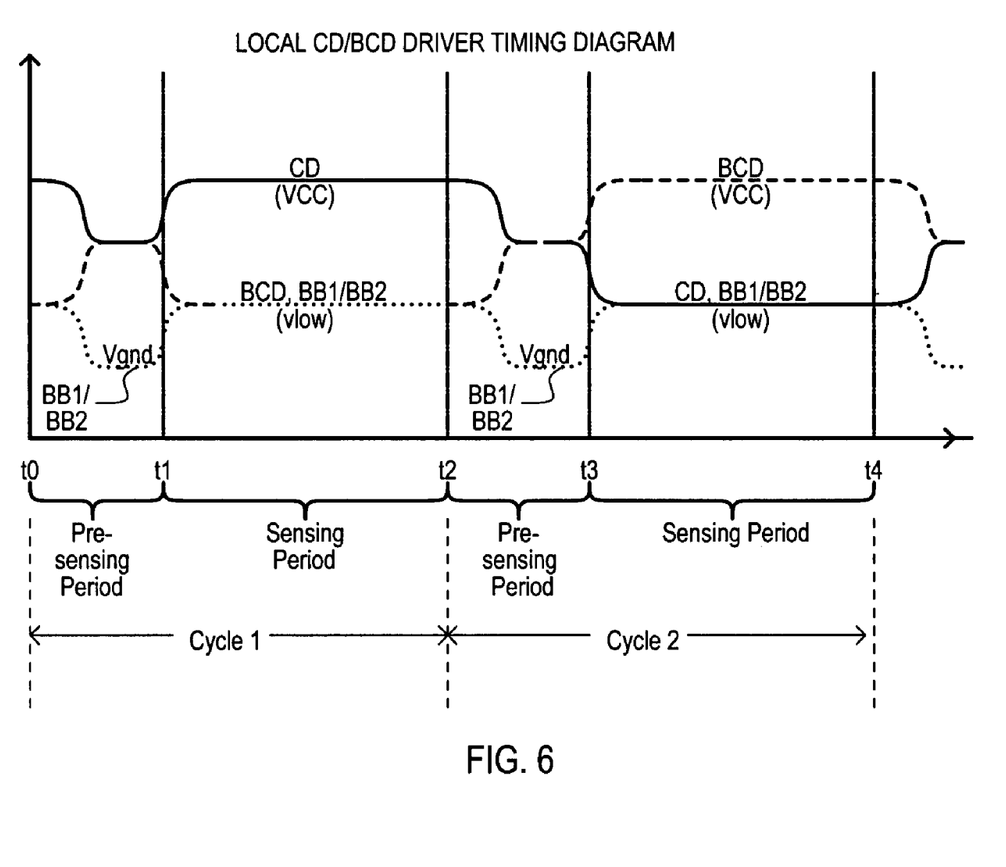
FIG. 6 is a timing diagram showing the operation of the embodiment shown in FIG. 5.

The operation of the driver circuit 500 of FIG. 5 will now be described with reference to FIG. 6. FIG. 6 shows a first pre-sensing period between times t0 and t1, a first sensing period between times t1 and t2 in which a compare data values CD and BCD are high and low, respectively, a second pre-sensing period between times t2 and t3, and a second sensing period between times t3 and t4 in which a compare data values CD and BCD are low and high, respectively.

Referring now to FIG. 5 in conjunction with FIG. 6, shortly after time t0, a compare data enable signal CDen can transition low, resulting in equalization signals eq and eqb transitioning high and low, respectively. Further, compare and complementary compare data control circuits (502 and 504) can provide high impedance output values. As a result, within first and second driver circuits (508-0 and 508-1), transistors P51, N51, P52 and N53 can be turned off. However, due to equalization signal eq, transistors N52 and N54 can be turned on, driving bit lines BB1 and BB2 to the VSS potential. Further, due to equalization signals eq and eqb, transistor P53 and N55 can be turned on, equalizing the potential between complementary compare data lines CD and BCD, thereby conserving charge.

In this way, in a pre-sensing period, bit lines BB1 and BB2 can be set to a low supply level (VSS), while complementary compare data lines CD and BCD are equalized. This is shown in FIG. 6 by lines BB1/BB2 being at the "Vgnd" potential.

At about time t1, a compare data enable signal CDen can transition high, resulting in equalization signals eq and eqb transitioning low and high, respectively. Further, compare data value cdata and complementary data value bcdata can be driven high and low, respectively. Within first and second driver circuits (508-0 and 508-1), transistors P51 and N53 are turned on, while transistors N51 and P52 are turned off. As a result, compare data line CD can be driven high. Further, due to equalization signals eq and eqb, transistors N52 and N54 are turned off, isolating the bit lines BB1 and BB2 from the low power supply VSS. Within equalization circuit 510, transistors P53 and N55 can be turned off, while transistor N56 can be turned on. As a result, compare data line BCD can be coupled to bit lines BB1 and BB2 by operation of transistors N56 and N53.

In this way, during a sensing period, one data value (in this case CD) can be driven high, while the other (in this case BCD) can be equalized with bit lines BB1 and BB2 to a potential Vlow. Such a "double" equalization arrangement can conserve charge over approaches that drive compare data lines between full logic values (e.g., between VCC and VSS).

Shortly after time t2, signals can enter the second pre-sensing state. Operations in the second pre-sensing period can follow those of the first pre-sensing period.

At about time t3, a compare data enable signal CDen can transition high once again, resulting in a sensing period that generally follows that described above at time t1. However, unlike the previous sensing period, compare data value cdata and complementary data value bcdata can be driven low and high, respectively. As a result, complementary compare data line BCD can be driven high by operation of p-channel transistor P52, while compare data line CD can be coupled to bit lines BB1 and BB2 by operation of transistors N56 and N51.

In this way, regardless of a given compare data value (e.g., either high or low), one compare data line can be driven high, while the other can be equalized with bit lines BB1 and BB2 to a potential Vlow.

In a preferred embodiment, a low equalization potential Vlow, can be about the same as the equalization potential for match lines and PVSS lines. More preferably, a low equalization voltage Vlow can be about 300–330 mV.

A general power consumption calculation for a compare data line can be given as follows:

Power Consumption=Freq×C×signal×$VCC$

A term "Freq" is a frequency of operation, "C" is a total capacitance of a compare data line, a "signal swing" is the voltage swing for a compare data line, and "VCC" is a power supply voltage. The above equation may be reduced as follows:

Power Consumption=Freq×C×½(VCC−Vlow)×VCC
Power Consumption=Freq×C×½(VCC−⅓VCC)×VCC
Power Consumption=Freq×C×⅓VCC×VCC
Power Consumption=⅓(Freq×C×$VCC^2$).

The resulting power consumption value contrasts sharply with conventional arrangements that provide full swing voltages between compare data lines on each compare cycle, which would be about=Freq×C×$VCC^2$. Thus, the power savings of the present invention embodiment can be about ⅔(Freq×C×$VCC^2$), as compared to conventional approaches.

It is understood that the above embodiments have described a CAM device in which dynamic current can be conserved, as HIT conditions (which are typically less likely than MISS conditions) are detected rather than MISS conditions. Thus, the present invention will not include the repeated charging and discharging of multiple match lines between supply voltages, unlike the conventional approaches.

A CAM device according to the above embodiments can reduce current consumption by utilizing charge sharing between match lines and PVSS lines.

The embodiments have also described a CAM device in which compare data lines can include "double" equalization. That is, the compare data lines can be equalized in both a pre-sensing and a sensing period. This can further conserve current, thereby reducing power consumption.

The embodiments have further described a CAM device in which compare data lines can have a reduced voltage swing. In particular, such a voltage swing can be approximately ⅓ that of a supply voltage (e.g., ⅓ VCC). This also provides for power savings over arrangements that drive compare data lines between larger (e.g., full power supply) levels.

A CAM device according the above embodiments can provide larger noise margin as the large transition of multiple match lines can be avoided, as only HIT conditions are detected. This is in contrast to conventional arrangements that result in nearly all match lines making full logic transitions for each compare operation.

Due to any of the various current/charge conserving arrangements described above, the present invention can provide lower power operation. Further, faster operating speeds may be possible as voltage level swings are reduced.

Comparative features between the conventional approach of FIG. 10, Arsovski et al. II and the embodiment of FIGS. 2 and 4 are set forth below in Table 1.

TABLE 1

| Design | Current Consumption | Power | Speed | Power Supply | Process | Work |
|---|---|---|---|---|---|---|
| FIG. 10 | 0.36 uA/bit | 0.43 uW/bit | 133 MHz | 1.2 V | 130 nm | 3.2 fJ/bit/cycle |
| Arsovski et al. II | N/A | N/A | N/A | N/A | 130 nm | 1.3 fJ/bit/search |
| FIG. 2 | 0.11 uA/bit | 0.11 uW/bit | 250 MHz | 1.0 V | 90 nm | 0.56 fJ/bit/cycle |

In Table 1, a "Design" column identifies the design, "Current Consumption" identifies the amount of current consumed per compare bit, "Power" identifies the amount of power consumed per bit, "Speed" represents a clock speed of a device of the design, "Power Supply" is the voltage supplied to the device of the design, "Process" is the manufacturing process, "Work" is the amount of work done per bit.

From the above, it is seen that the embodiment of the present invention can provide advantageous low work values per bit.

Still further, the present invention can further limit leakage current by employing high threshold voltage (Vtn) devices in a discharge path between a compare stack and a low power supply voltage.

In addition, it is noted that while the above examples have shown compare data lines (CD and BCD) that are equalized with bit lines BB1 and BB2, such an implementation should not be construed as limiting the invention thereto. A compare data line may be equalized to any sort of isolatable node in order to provide a desired equalized potential value.

While the above embodiments have disclosed a sense amplifier in which a sensing device is a p-channel transistor, alternate embodiments can utilize an n-channel transistor as a sensing device.

For example, in the p-channel sensing arrangement of FIG. 2, if such a device is configured as a four terminal device (body connected to source), when the structure is repeated in a CAM device it can require considerable area. However, if the 4-terminal device is configured with it well of sense transistor P4 is connected to a supply voltage, a sensing speed of the sense transistor can be slower due to higher threshold voltage. In addition, in some processes, p-channel transistors can be the subject of greater process variation than n-channel transistors. Finally, at lower operating voltages and/or lower temperatures, a transistor switching time can be slower for p-channel devices. For all of these reasons, it may be preferable employ an n-channel transistor as a sensing device in lieu of a p-channel transistor.

Figure 7:
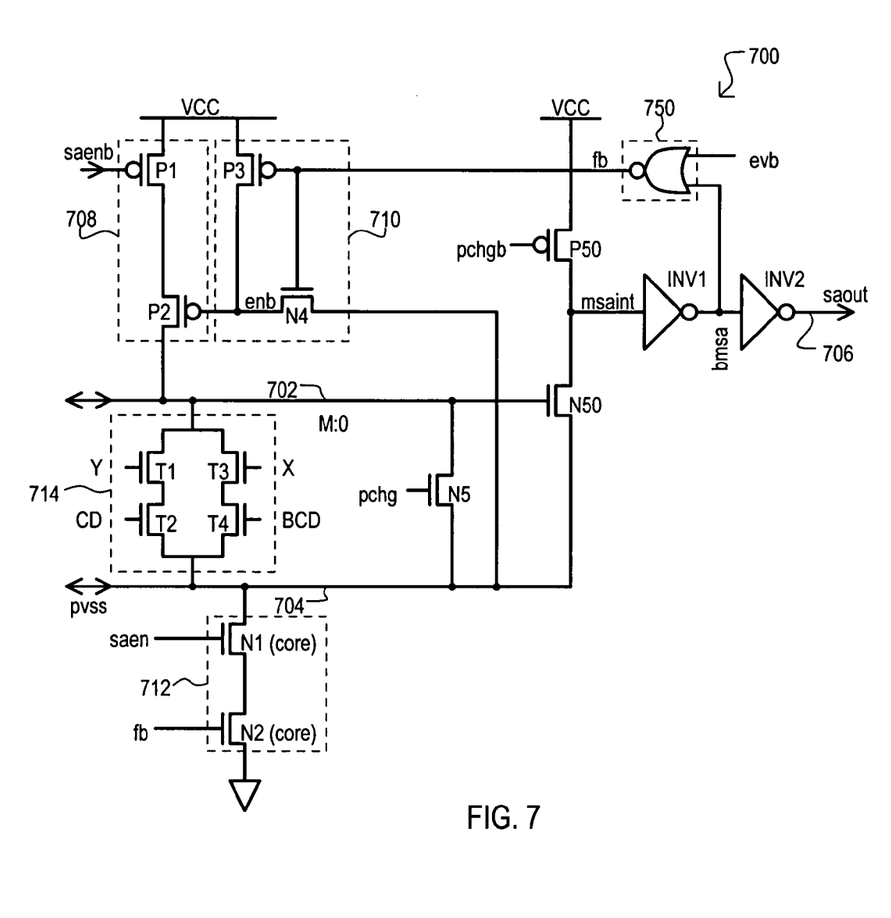
FIG. 7 is a schematic diagram of a sense amplifier according to another embodiment of the present invention.

An alternate embodiment sense amplifier that utilizes an n-channel sensing transistor is shown in FIG. 7 and designated by the general reference character 700. A sense amplifier 700 can have some of the same general components as the embodiment shown in FIG. 2, thus, like components will be referred to by the same reference character, but with the first digit being a "7" instead of a "2".

As understood by comparing FIG. 7 to FIG. 2, the embodiment of FIG. 7 differs from that of FIG. 2 in that an n-channel sensing device N50 has be substituted for a p-channel sensing device. N-channel sensing device N50 can have a gate connected to match line 702, a source connected to pseudo-VSS line 704, and a drain connected to sense node msaint.

The embodiment of FIG. 7 also includes a p-channel pre-sense device P50 connected between a high power supply VCC and sense node msaint. A gate of pre-sense device P50 can receive a precharge signal pchgb.

Sense amplifier 700 also includes feedback control circuit 750 that provides a feedback signal like bmsa of FIG. 2. More particularly, feedback control circuit 750 can receive signal bmsa and an evaluate low signal evb as inputs, and provide feedback signal fb as an output. Feedback signal fb can ensure the precharge transistor P2 is turned off in the event a "HIT" is detected. Further, feedback signal fb can turn off transistor N2 in discharge circuit 712.

The operation of a sense amplifier 700 will now be described in conjunction with a timing diagram shown in FIG. 3.

A pre-sensing period operation can be essentially the same as for the embodiment of FIG. 2, but with an active low precharge signal pchgb turning on pre-sense device P50 to precharge sense node msaint to a high level. Further, by operation of inverters INV1 and INV2, such a high value can be inverted to drive sense amplifier output node bmsa low and node saout high. With node bmsa low, by operation of feedback control circuit 750 (assuming evaluate signal evb is low) feedback signal fb will be high.

In this way, the sense amplifier 700 can be preset to a MISS (high in this case) state. This is in contrast to conventional approaches that preset sense nodes to a HIT state.

It is understood that in this embodiment, a resulting output node saout has the opposite logic state as the embodiment of FIG. 2. That is, a MISS state results output node saout is high, and in a HIT state output node saout is low.

At the end of pre-sensing period, sense amplifier enable signal saen can return high (and saenb can go low). As in the case of the embodiment of FIG. 2, PVSS line 704 can be pulled toward a low (e.g., VSS) potential. Further, precharge signal pchgb can transition to an inactive (in this case high) level, turning off pre-sense device P50 and equalization device N5. As a result, sense node msaint can be isolated from the VCC potential, and match line 702 and PVSS line 704 can be isolated from one another by a row of CAM cells (represented by portion 714).

A sensing period can have the same general operation as the embodiment of FIG. 2.

In the event of a HIT, match line 702 will remain essentially electrically isolated from PVSS line 704. As a result, match line 702 will begin to rise in potential due to the operation of charge circuit 708, while at the same time, the potential of PVSS line 704 falls. When this potential difference exceeds the threshold voltage (Vtn) of sense transistor N50, transistor N50 can turn on, pulling sense node msaint to a lower potential. When the potential at msaint node exceeds a threshold of inverter INV1, inverter INV1 drives sense amplifier output node bmsa high. This drives sense amplifier output node saout low, indicating a match (HIT) condition.

Like the embodiment of FIG. 2, the embodiment of FIG. 7 has current conserving aspects.

In particular, in the event of a HIT, as sense amplifier output node bmsa is driven high. By operation of feedback circuit 750, feedback signal fb is driven low. As a result, within feedback circuit 710, transistor P3 is turned on and transistor N4 is turned off, pulling enable node enb high. This turns off transistor P2, once again isolating match line 702 from a high voltage. At the same time, a low feedbacks signal fb results in transistor N2 being turned off. This isolates PVSS line 704 from a low voltage.

In this way, current paths to match line 702 and PVSS line 704 are automatically isolated in the event of a hit.

In the event of a MISS, match line 702 can be electrically connected to PVSS line 704. Thus, match line 702 and PVSS line 704 will essentially track one another in potential, maintaining the source and gate of sense transistor N50 at essentially the same voltage. As a result, sense transistor N50 can remain turned off, and sense node msaint can remain at the pre-set high potential. Sense amplifier output node bmsa remains low, while sense amplifier output node saout remains high, indicating a MISS condition.

Figure 8:
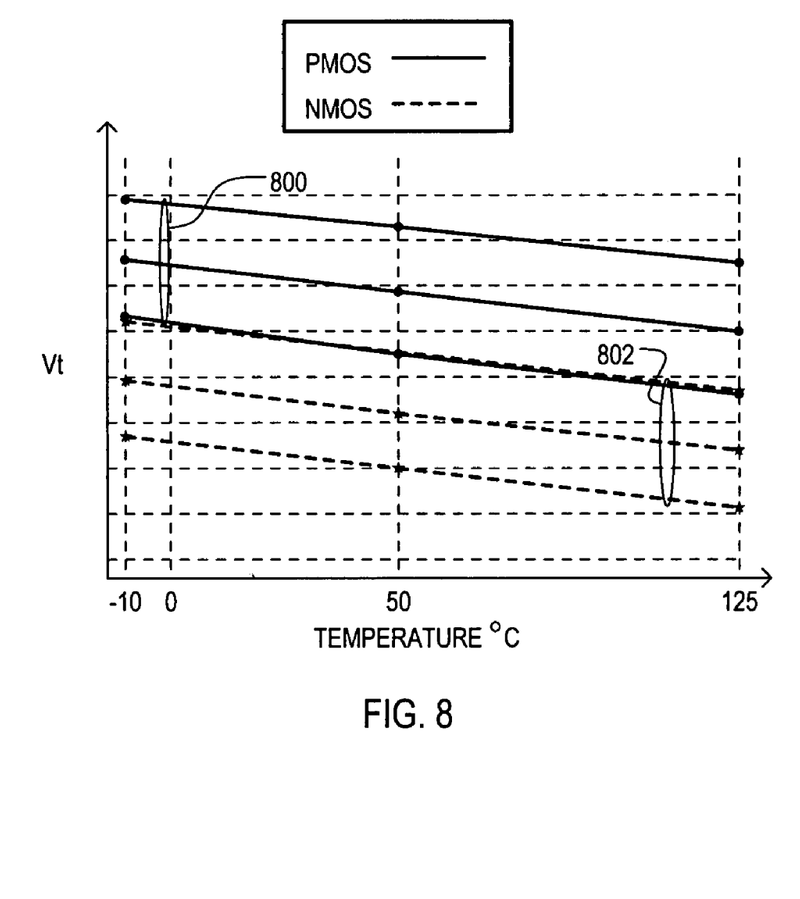
FIG. 8 is a graph showing simulation results for threshold voltages of a p-channel sensing device versus an n-channel sensing device.

Utilizing an n-channel sensing device can result in advantages over p-channel sensing. In particular, threshold voltages for an n-channel device can be lower over operating conditions/process variations, resulting in faster sensing of a HIT state. Such faster sensing allows for faster operation of a CAM device. Further, due to the advantageous feedback arrangement, faster sensing translates to lower current consumption. FIGS. 8–10 illustrate examples of differences between n-channel device sensing and p-channel device sensing.

FIG. 8 is a graph illustrating simulation results for threshold voltages of an n-channel sensing device and p-channel sensing device over a range of process variations and temperatures. Solid lines 800 represent variations in the models for a p-channel device. Dashed lines 802 represent variations in the models for an n-channel device. As shown by the graph, n-channel device threshold voltages can have a tighter variation and overall lower magnitude than p-channel threshold voltages. While process variables can differ for each particular manufacturer, the above simulation results represent one example of a p-channel device having a width/length (W/L) size of 0.7 µm/0.2 µm versus an n-channel device with a W/L size of 0.6 µm/0.3 µm, with p-channel threshold voltages ranging from about 0.55 volts to 0.33 volts and n-channel threshold voltages ranging from about 0.41 volts to 0.20 volts.

It is understood that while the various aspects of the particular embodiments set forth herein have been described in detail, the present invention could be subject to various changes, substitutions, and alterations without departing from the spirit and scope of the invention.

What is claimed is:

1. A content addressable memory (CAM) device, comprising:
 a plurality of match lines, each coupled to a row of CAM cells;
 an electrically isolatable line corresponding to each match line and coupled to the match line by at least one equalization device;
 a charge circuit coupled between each electrically isolatable line and a first power supply node, each charge circuit having a controllable impedance path; and
 a sense device corresponding to each match line, each sense device generating a match indication when the potential of the match line varies from the potential of the corresponding electrically isolatable line.

2. The CAM device of claim 1, further including:
 a pre-sense device coupled between each sense node and a first predetermined potential; and
 each sense device comprises a sense transistor that provides a low impedance path between the corresponding sense node and a second predetermined potential when a match condition occurs between an applied compare data value and data stored in the row of CAM cells, and the sense transistor provides a relatively high impedance path between the corresponding sense node and the second predetermined potential when a match condition does not occur between an applied compare data value and data stored in the row of CAM cells.

3. The CAM device of claim 1, further including:
 a plurality of compare data line pairs that provide a compare data value to each row of CAM cells in a sensing period; and
 a driver device that electrically connects at least one compare data line of each compare data line pair to a corresponding bit line in the sensing period, the bit line being different than corresponding compare data line.

4. The CAM device of claim 1, further including:
 a plurality of compare data line pairs that provide a compare data value to each row of CAM cells in a sensing period;
 an equalization driver device that electrically connects compare data lines of each compare data line pair to one another in a pre-sensing period, the pre-sensing period being different than a sensing period; and
 the equalization devices electrically connect the corresponding match line and electrically isolatable line in the pre-sensing period.

5. The CAM device of claim 1, further including:
 a plurality of compare data line pairs that provide a compare data value to each row of CAM cells in a sensing period;
 a plurality of bit line pairs that provide data values to each row of CAM cells in a data write operation; and
 a plurality of first driver circuits each coupled to one compare data line and one bit line, each first driver circuit including a first driver device having a controllable impedance path coupled between a first supply potential and the bit line, a second driver device having a controllable impedance path coupled between the bit line and the compare data line, and a third driver device having a controllable impedance path coupled between a second supply potential and the compared data line.

6. The CAM device of claim 5, further including:
a compare data control circuit coupled to each first driver circuit that receives a compare data value, the compare data control circuit
   enabling the first driver device and disabling the second driver device when the compare data value has a first value,
   enabling the second driver device and disabling the first driver device when the compare data value has a second value, and
   disabling the first driver device and second driver device in a pre-sensing period that is different than the sensing period.

7. The CAM device of claim 1, further including:
each of the sense devices provides a low impedance path between the corresponding sense node and a second potential after a predetermined first time period when a match condition occurs between an applied compare data value and data stored in the row of CAM cells;
at least one dummy match line that generates a dummy match indication regardless of the compare data value after a predetermined second time period that is longer than the first time period; and
at least one charge supply device coupled between each match line and a supply voltage, the charge supply devices being commonly disabled in response to the dummy match indication.

8. The CAM device of claim 1, wherein:
each sense device comprises a p-channel transistor having a source coupled to the corresponding match line and a gate coupled to the corresponding electrically isolatable line.

9. The CAM device of claim 1, wherein:
each sense device comprises an n-channel transistor having a source coupled to the corresponding electrically isolatable line and a gate coupled to the corresponding match line.

10. A content addressable memory (CAM) device, comprising:
a plurality of compare data line pairs that provide a compare data value to a plurality of CAM cell rows in a sensing period; and
a compare data line driver circuit corresponding to each compare data line pair, each compare data line driver circuit including at least one driver equalization device that electrically connects one compare data lines of the pair to at least one electrically isolatable node in the sensing period and at least one pre-sensing equalization device that electrically connects the compare data lines of the pair to one another in a pre-sensing period, the pre-sensing period being different than the sensing period.

11. The CAM device of claim 10, wherein:
each compare data line pair includes a compare data line and complementary compare data line; and
the compare data line driver circuit includes
   a first driver equalization device that connects the compare data line to a first electrically isolatable node when a corresponding compare data value is low, and
   a second driver equalization device that connects the complementary compare data line to a power supply potential when the corresponding compare data value is high.

12. The CAM device of claim 11, further including:
a bit line pair corresponding to each compare data line pair for providing write data to a selected CAM cell row in a write operation; and
the first electrically isolatable node is a first bit line of the bit line pair, and a second electrically isolatable node is a second bit line of the bit line pair.

13. The CAM device of claim 10, wherein:
each compare data line driver circuit includes
a first driver circuit having a first driver equalization device coupled between a first electrically isolatable node and one compare data line, a first pull up device coupled between a high power supply voltage and the one compare data line, and a first pre-charge device coupled between a low power supply voltage and the first electrically isolatable node.

14. The CAM device of claim 10, wherein:
the at least one electrically isolatable node includes first and second electrically isolatable nodes; and
each compare data line driver circuit includes
   the at least one pre-sense equalization device coupled between the compare data lines of the compare data line pair, and
   at least one node equalization device coupled between the first and second electrically isolatable nodes that is enabled in the sensing period.

15. The CAM device of claim 10, wherein:
each of the CAM cell rows is disposed between a corresponding match line and pseudo supply line;
each corresponding match line and pseudo supply line being electrically connected to one another in the pre-sense period by at least one match equalization device while at the same time being electrically isolated from any power supply voltage.

16. The CAM device of claim 10, further including:
a first charging circuit corresponding to each pseudo supply line that couples the pseudo supply line a first supply voltage in the sensing period; and
a second charging circuit corresponding to each match line that couples the match line to a second supply voltage in the sensing period.

17. A method for sensing compare results in a content addressable memory (CAM) device, comprising the steps of:
in a pre-sense period, equalizing match lines with corresponding electrically isolatable pseudo supply lines and setting sense nodes corresponding to each match line to mismatch levels; and
in a sense period, generating a match indication at a match node when the corresponding match line differs in potential from the corresponding pseudo supply line.

18. The method of claim 17, wherein:
equalizing match lines with corresponding pseudo supply lines includes activating at least one equalization device between each match line and the corresponding pseudo supply line.

19. The method of claim 17, further including:
in the sense period,
comparing a multi-bit compare data value to a multi-bit stored value, and
providing a first low Impedance path between each pseudo supply line and a first supply potential and a second low impedance path between the corresponding match line and a second supply potential.

20. The method of claim 17, further including:
in the pre-sense period, equalizing compare data line pairs; and in the sense period, providing complementary compared data bit values on each compare data line pair.

21. The method of claim 17, further including:

in the sense period, providing complementary compared data bit values on compare data line pair by driving one compare data line of each pair to first supply potential, and equalizing the other compare data line of each pair with at least one electrically isolatable node.

22. The method of claim 21, further including:

providing write data on at least one bit line in a write operation; and the at least one electrically isolatable node includes at least one bit line.

* * * * *